United States Patent
Tang et al.

(10) Patent No.: US 10,657,207 B1
(45) Date of Patent: May 19, 2020

(54) INTER-CELL BRIDGE DEFECT DIAGNOSIS

(71) Applicant: Mentor Graphics Corporation, Wilsonville, OR (US)

(72) Inventors: Huaxing Tang, Wilsonville, OR (US); Manish Sharma, Wilsonville, OR (US); Szczepan Urban, Gowarzewo (PL)

(73) Assignee: Mentor Graphics Corporation, Wilsonville, OR (US)

( * ) Notice: Subject to any disclaimer, the term of this patent is extended or adjusted under 35 U.S.C. 154(b) by 75 days.

(21) Appl. No.: 15/972,812

(22) Filed: May 7, 2018

Related U.S. Application Data

(60) Provisional application No. 62/502,702, filed on May 7, 2017.

(51) Int. Cl.
    *G06F 17/50* (2006.01)
(52) U.S. Cl.
    CPC ...... *G06F 17/5022* (2013.01); *G06F 17/5036* (2013.01); *G06F 17/5081* (2013.01)

(58) Field of Classification Search
    CPC ............. G06F 17/5009; G06F 17/5022; G06F 17/5036; G06F 11/261; G06F 11/263
    USPC .................. 714/735–737; 716/136, 106
    See application file for complete search history.

(56) References Cited

U.S. PATENT DOCUMENTS

| | | | | |
|---|---|---|---|---|
| 2006/0111873 A1* | 5/2006 | Huang | ............ | G01R 31/318547 702/185 |
| 2007/0234161 A1* | 10/2007 | Blanton | ............. | G01R 31/2846 714/736 |
| 2008/0111558 A1* | 5/2008 | Sharma | .......... | G01R 31/318569 324/537 |

* cited by examiner

*Primary Examiner* — Paul Dinh

(57) ABSTRACT

Failing test pattern simulations are performed to determine initial defect suspects based on injecting faults to defect candidate sites which are derived based on test responses. Initial inter-cell bridge suspects are then determined from cells in the initial defect suspects based on layout information and electrical information of the circuit. Passing test pattern simulations are performed to determine inter-cell bridge suspects from the initial inter-cell bridge suspects.

19 Claims, 4 Drawing Sheets

Flow chart 400

Flow chart 400

INTER-CELL BRIDGE DEFECT DIAGNOSIS

RELATED APPLICATIONS

This application claims the benefit of U.S. Provisional Patent Application No. 62/502,702, filed on May 7, 2017, titled "Inter-Cell Bridge Defect Diagnosis," and naming Huaxing Tang et al. as inventors, which application is incorporated entirely herein by reference.

FIELD OF THE DISCLOSED TECHNIQUES

The presently disclosed techniques relates to circuit testing and defect diagnosis. Various implementations of the disclosed techniques may be particularly useful for identifying inter-cell bridge defect suspects.

BACKGROUND OF THE DISCLOSED TECHNIQUES

Traditionally, scan diagnosis is used to determine the most likely faulty locations and fault types for a given failing integrated circuit device. The diagnosis results guide physical failure analysis (PFA) to locate defects and identify the root cause. Defects are typically classified into two categories based on defect locations. A defect in a library cell is called a cell internal defect, and a defect on interconnecting wires is called an interconnect defect. Various fault models are developed to address different fault effects and layout information is incorporated into the diagnosis process. The improved diagnosis accuracy and resolution enable failure analysis engineers to focus on smaller areas. This leads to higher PFA success rates and lower turnaround time and costs. Scan diagnosis has also been applied directly to yield analysis. Based on analyzing volume diagnosis results, systematic yield limiters can be identified. Despite these developments, conventional diagnosis techniques can still miss some defects such as bridge defects located between neighboring cells or generate too many cell suspects for the observed failing test responses. New diagnosis techniques that can address inter-cell bridge defects effectively and efficiently are needed.

BRIEF SUMMARY OF THE DISCLOSED TECHNIQUES

Various aspects of the disclosed technology relate to inter-cell bridge defect diagnosis. In one aspect, there is a method, executed by at least one processor of a computer, comprising: performing failing test pattern simulations to determine initial defect suspects based on injecting faults to defect candidate sites, the defect candidate sites determined based on test responses, the test responses obtained by applying test patterns to a circuit for testing, and the test responses comprising failing bits; determining initial inter-cell bridge suspects from cells in the initial defect suspects based on layout information and electrical information of the circuit, the determining comprising identifying pairs of neighboring cells based on the layout information, the electrical information of the circuit comprising cell internal signal information; and performing passing test pattern simulations to determine inter-cell bridge suspects from the initial inter-cell bridge suspects.

The method may further comprise: determining final defect suspects from the inter-cell defect suspects and other defect suspects determined based on the failing test pattern simulations and the passing test pattern simulations.

The defect candidate sites may be determined based on path-tracing from the failing bits into a circuit design of the circuit or based on a fault dictionary. The faults may comprise stuck-at faults. The faults may further comprise faults for cell internal defects. The cell internal signal information may be obtained based on transistor-level circuit simulations or switch-level circuit simulations.

The electrical information of the circuit may further comprise switch-level netlists of the cells or transistor-level netlists of the cells, and the determining initial inter-cell bridge suspects may be further based on driving strengths derived based on the switch-level netlists of the cells or the transistor-level netlists of the cells. The determining initial inter-cell bridge suspects may be still further based on faults for cell internal defects and the failing test pattern simulations.

In another aspect, there are one or more non-transitory computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclose techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

General Considerations

Various aspects of the disclosed technology relate to inter-cell bridge defect diagnosis. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "perform" and "determination" to describe the disclosed method or the device function/structure. Such terms are high-level descriptions. The actual operations or functions/structures that correspond to these terms will vary depending on the particular implementation and are readily discernible by one of ordinary skill in the art.

Additionally, as used herein, the term "design" is intended to encompass data describing an entire integrated circuit device. This term also is intended to encompass a smaller group of data describing one or more components of an entire device such as a portion of an integrated circuit device nevertheless.

Illustrative Operating Environment

Figure 1:
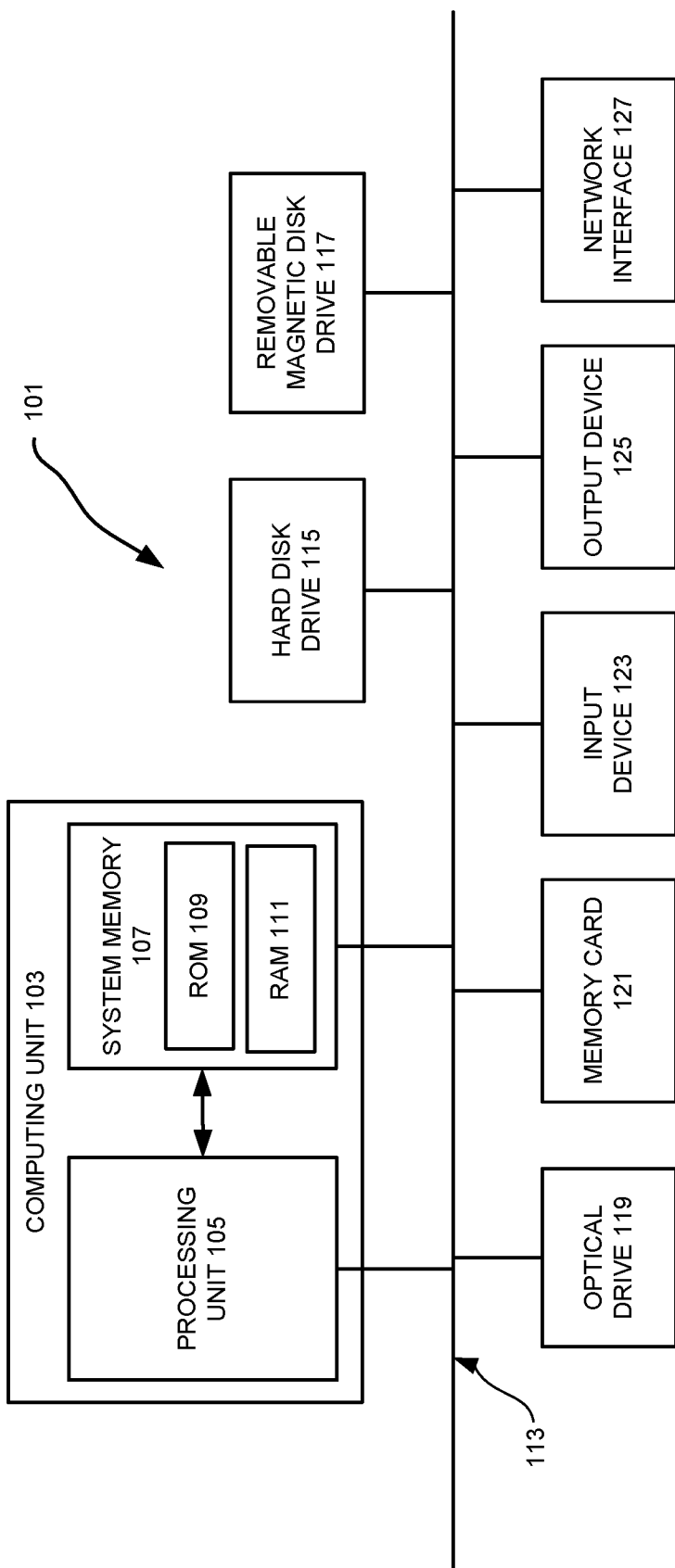
FIG. 1 illustrates a programmable computer system with which various embodiments of the disclosed technology may be employed.

Various examples of the disclosed technology may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but it will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it is not intended to be limiting. Various embodiments of the disclosed technology may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the disclosed technology may be implemented using a multiprocessor computer, a plurality of single and/or multiprocessor computers arranged into a network, or some combination of both.

Design for Test, Test Pattern Generation, Testing and Diagnosis

The reduction in feature size increases the probability that a manufacture defect in the integrated circuit will result in a faulty chip. A very small defect can result in a faulty transistor or interconnecting wire. Even a single faulty transistor or wire can cause the entire chip to function improperly. Manufacture defects are unavoidable nonetheless, no matter whether the manufacturing process is at the prototype stage or the high-volume manufacturing stage. It is thus necessary to test chips during the manufacturing process. Diagnosing faulty chips is also needed to ramp up and to maintain the manufacturing yield.

Testing typically includes applying a set of test stimuli (test patterns) to the circuit-under-test and then analyzing responses generated by the circuit-under-test. Functional testing attempts to validate that the circuit-under-test operates according to its functional specification while structural testing tries to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (test pattern) generation to focus on testing a limited number of relatively simple circuit elements rather than having to deal with an exponentially exploding multiplicity of functional states and state transitions.

To make it easier to develop and apply test patterns, certain testability features are added to circuit designs, which is referred to as design for test or design for testability (DFT). Scan testing is the most common DFT method. In a basic scan testing scheme, all or most of internal sequential state elements (latches, flip-flops, et al.) in a circuit design are made controllable and observable via a serial interface. These functional state elements are usually replaced with dual-purpose state elements called scan cells. Scan cells are connected together to form scan chains—serial shift registers for shifting in test patterns and shifting out test responses. A scan cell can operate as originally intended for functional purposes (functional/mission mode) and as a unit in a scan chain for scan (scan mode). A widely used type of scan cell include an edge-trigged flip-flop with two-way multiplexer for the data input. The two-way multiplexer is typically controlled by a single control signal called scan_enable, which selects the input signal for a scan cell from either a scan signal input port or a system signal input port. The scan signal input port is typically connected to an output of another scan cell while the system signal input port is connected to the functional logic. Scan cells can serve as both a control point and an observation point. Control points can be used to set certain logic values at some locations of the circuit-under-test, exciting (activating) a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Test patterns for scan testing are typically generated through an automatic test pattern generation (ATPG) process. ATPG usually focuses on a set of faults derived from a gate-level fault model. A defect is an error caused in a device during the manufacturing process. A fault model is a description of how a defect alters design behavior. In another word, a defect is a flaw or physical imperfection that may lead to a fault. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a site is said to be detected by a test pattern if a test response value captured by a scan cell or a primary output is different than the expected value. The objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which should be directly proportional to test application time. Here, the fault coverage is defined as a ratio of the number of detected faults vs. the total number of faults.

The most popular fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. Delay faults cause errors in the functioning of a circuit based on its timing. They are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period. Cell internal fault models can be derived using transistor-level circuit simulations (analog simulations). This approach can pinpoint the defect location within a cell for various cell internal defects.

During the circuit design and manufacturing process, a manufacturing test screens out chips (dies) containing defects. The test itself, however, does not identify the reason for the unacceptable low or fluctuating yield that may be observed. Physical failure analysis (PFA) can inspect the faulty chip to locate the defect location(s) and to discover the root cause. The process usually includes etching away certain layers and then imaging the silicon surface by scanning electronic microscopy or focused ion beam systems. This PFA process is laborious and time consuming. To facilitate the PFA process, diagnosis (also referred to as scan diagnosis) is often employed to narrow down possible locations of the defect(s) based on analyzing the fail log (fail file, failure file). The fail log typically contains information about when (e.g., tester cycle), where (e.g., at what tester channel), and how (e.g., at what logic value) the test failed and which test patterns generate expected test responses. The layout information of the circuit design may also be employed to further reduce the number of defect suspects.

Diagnosis includes logic diagnosis (sometimes referred to as scan diagnosis or diagnosis) and chain diagnosis. Logic diagnosis may employ a fault dictionary or directly examine the syndrome (i.e., the effect) of the failing chip to determine likely defect locations (defect suspects). The latter approach may include structural pruning (backtracing), fault injection, and evaluation (fault simulation for both failing and passing test patterns). The quality of diagnosis can be measured by diagnostic resolution (the number of the real defects vs. the number of the defect suspects). Diagnostic resolution is linked not only to the algorithm used for diagnosis but also to the test patterns used for the manufacturing test (manufacturing test patterns). To enhance the diagnosis quality, a diagnostic test pattern generation process may be employed. This process generates test patterns that can refine the set of defect suspects.

All of the above mentioned processes, design insertion for testing, test pattern generation, and logic diagnosis, are normally performed by various electronic design automation tools such as those in the Tessent family of software tools available from Mentor Graphics Corporation, Wilsonville, Oreg.

Inter-Cell Bridge Defects

A cell is a high-level representation of a component within a schematic diagram or physical layout of an electronic circuit. In designing application-specific integrated circuits (ASICs) with mostly digital-logic features, a standard cell library is usually used. The standard cell library comprises pre-defined digital building blocks—standard cells. A standard cell is a group of transistor and interconnecting structures that provides a boolean logic function (e.g., AND, OR, XOR, XNOR, inverters) or a storage function (flip-flop or latch). These standard cells have optimized layouts and are fully characterized for performance. They typically are of a fixed height, enabling them to be placed in rows and thus easing the process of automated digital layout. Standard cell libraries provide identical functional cells between process nodes or between different process technologies, making cell-based circuits more scalable and portable. In the present disclosure, a standard cell is referred to as a cell. A cell may also be a customized cell.

Figure 2:
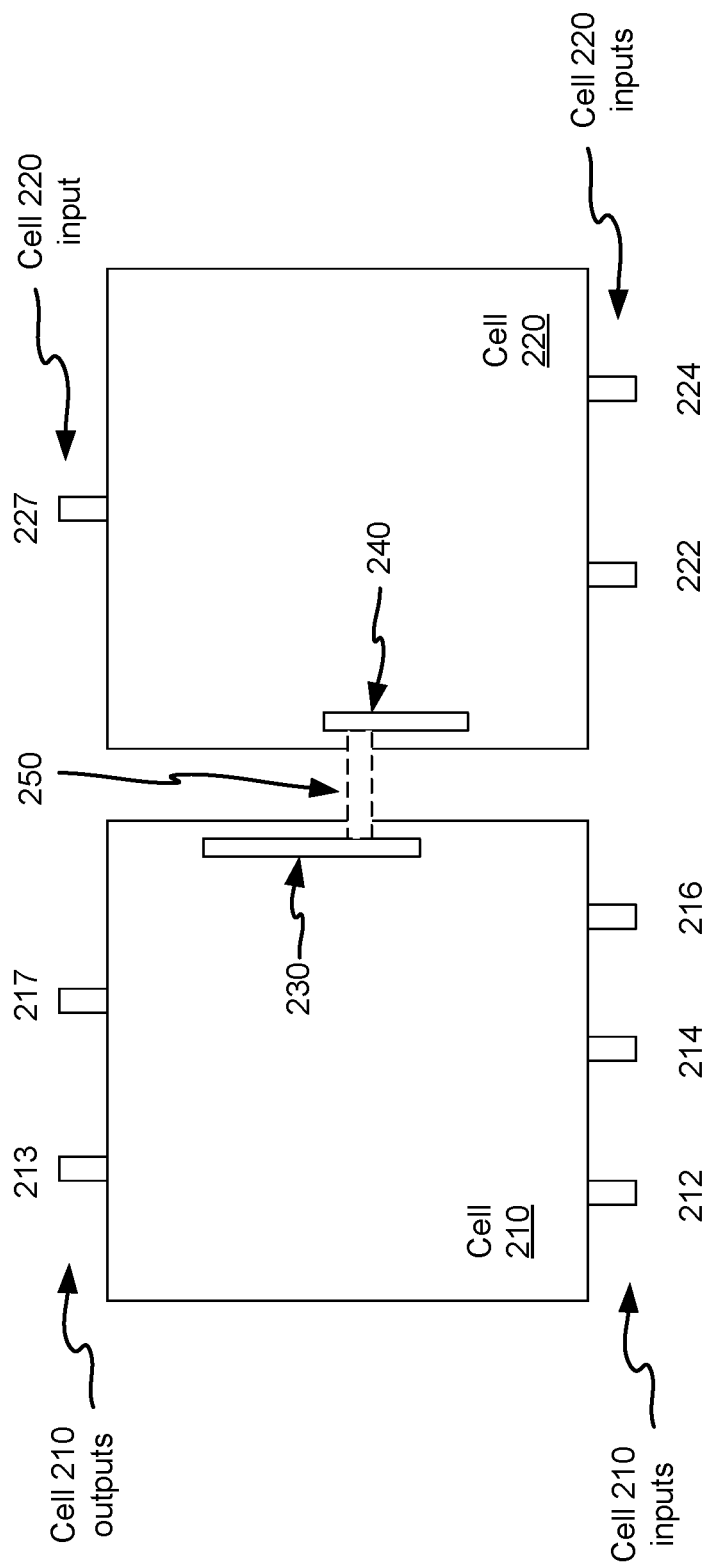
FIG. 2 illustrates an example of an inter-cell bridge defect.

FIG. 2 illustrates an example of an inter-cell bridge defect. In the figure, there are two cells 210 and 220. The cell 210 has three inputs 212, 214, and 216 and two outputs 213 and 217. The cell 220 has two inputs 222 and 224 and one output 227. An unwanted bridge, an inter-cell bridge defect 250, connects an interconnecting wire 230 in the cell 210 with an interconnecting wire 240 in the cell 220. The existence of the inter-cell bridge defect 250 can cause the signal at one of the interconnecting wires to deviate from its good-machine value. For example, the input signals of the cells 210 and 220 may dictate that the interconnecting wires 230 and 240 should be at "0" and "1", respectively, when no defect exists. Due to the inter-cell bridge defect 250, however, both of the interconnecting wires 230 and 240 may have an identical logical value. Whether the identical logical value is 0 or 1 may depend on driving strengths of the transistors coupled to them in each of the cells.

A fault effect (logic value opposite to the good-machine value) on the interconnecting wire 230 or the interconnecting wire 240 may be propagated to one or more observation points (scan cells or primary outputs), resulting in one or more failing bits in a test response. Different test patterns may generate test responses having different failing bits or no failing bits. On the other hand, the fault cannot be activated and no fault effect can be observed if the interconnecting wire 230 and the interconnecting wire 240 have the same good-machine value. It should be noted that the inter-cell bridge defect shown in FIG. 2 is just an example. An inter-cell bridge defect may be a bridge between circuit components including one other than an interconnecting wire.

Similar to some techniques for diagnosing cell internal defect, one can create fault models for all possible inter-cell defects first and use these models for diagnosis. While it may achieve accurate diagnosis results, this approach requires a long analog simulation time to generate a large number of the inter-cell bridge faults. A cell library can have up to ten thousand cells. The number of possible cell pairs from these cells can reach one hundred million. In addition, each cell pair can have multiple potential inter-cell bridge defects depending on layout configurations and layout features near cell boundaries. The huge number of potential inter-cell bridge defects make it impractical to build inter-cell bridge fault models for a cell library in advance.

Creating fault models only for cell pairs existing in the circuit-under-test can significantly reduce the number of potential inter-cell bridge defects, but it is also not an efficient approach. A design typically has thousands of cells and thus, it typically has thousands of cell pairs. The number of cells in a large design can reach half a billion. The simulation time needed for creating the fault models is thus still too long. Moreover, the fault models created for one particular design cannot be readily used for another design. For each circuit design, a significant amount of time and effort needs to be spent on the fault model creation, rendering the approach inefficient.

Circuit Defect Diagnosis Tool

Figure 3:
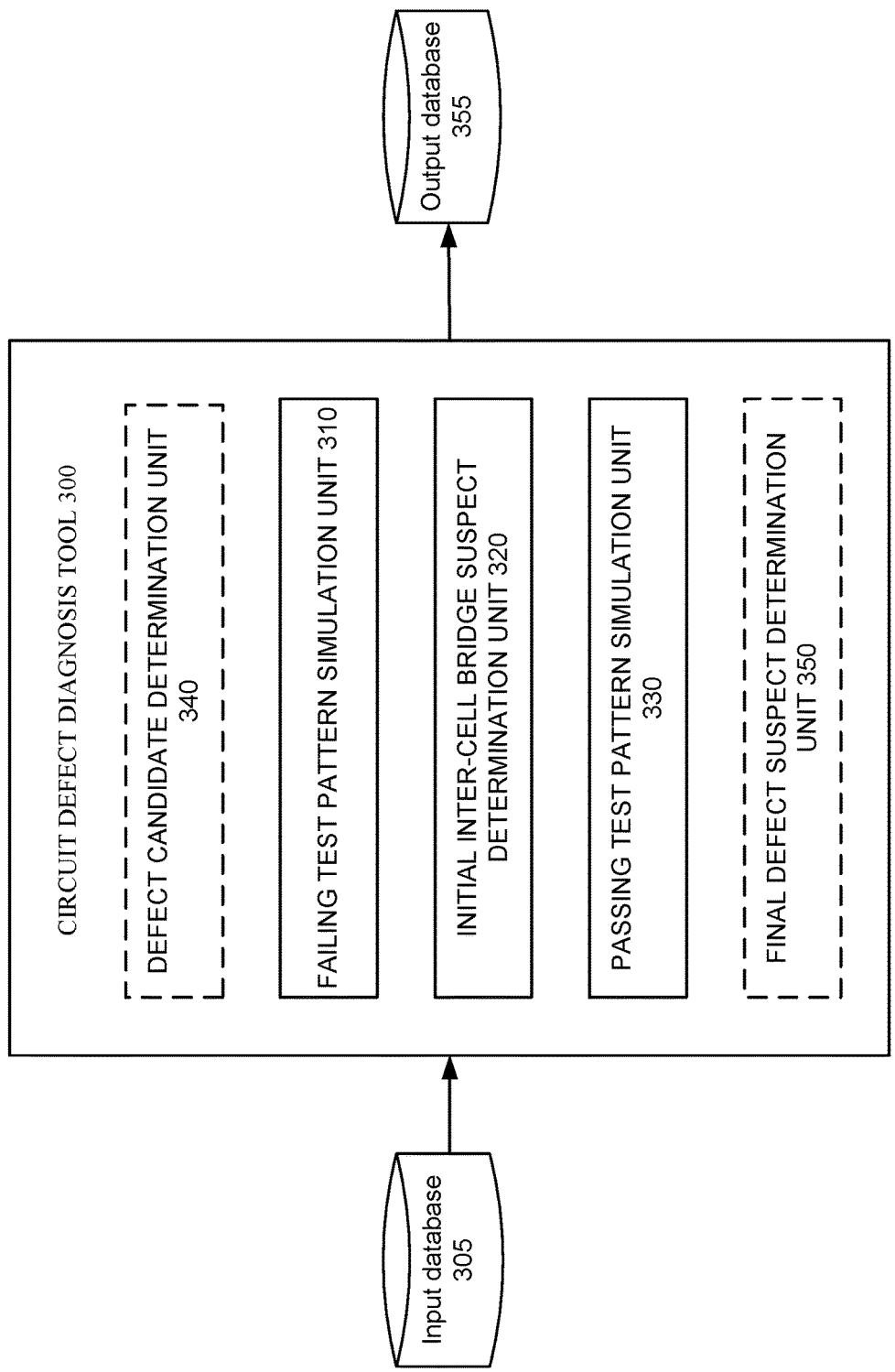
FIG. 3 illustrates a circuit defect diagnosis tool according to various embodiments of the disclosed technology

FIG. 3 illustrates an example of a circuit defect diagnosis tool 300 that may be implemented according to various embodiments of the disclosed technology. As seen in this figure, the circuit defect diagnosis tool 300 includes a failing test pattern simulation unit 310, an initial inter-cell bridge suspect determination unit 320, and a passing test pattern simulation unit 330. Some implementations of the circuit defect diagnosis tool 300 may cooperate with (or incorporate) one or more of a defect candidate determination unit 340, a final defect suspect determination unit 350, an input database 305, and an output database 355.

As will be discussed in more detail below, the circuit defect diagnosis tool 300 receives layout and electrical information of a circuit design, test patterns, test responses, and defect candidate sites from the database 305. The electrical information of the circuit comprises cell internal signal information. The test responses are generated by applying the test patterns to a circuit. The circuit is fabricated based on the circuit design. The test responses comprise failing bits. The defect candidate sites may be determined based on the test responses by the defect candidate determination unit 340. The failing test pattern simulation unit 310 performs failing test pattern simulations to determine initial defect suspects based on injecting faults to the defect candidate sites. The initial inter-cell bridge suspect determination unit 320 determines initial inter-cell bridge suspects from cells in the initial defect suspects based on the layout information and the electrical information of the circuit. The passing test pattern simulation unit 330 performs passing test pattern simulations to determine inter-cell bridge suspects from the initial inter-cell bridge suspects. The final defect suspect determination unit 350 may determine final defect suspects from the inter-cell defect suspects and other defect suspects derived based on the failing/passing test pattern simulations. The circuit defect diagnosis tool 300 may store intermediate and final results in the output database 355.

As previously noted, various examples of the disclosed technology may be implemented by one or more computing systems, such as the computing system illustrated in FIG. 1. Accordingly, one or more of the failing test pattern simulation unit 310, the initial inter-cell bridge suspect determination unit 320, the passing test pattern simulation unit 330, the defect candidate determination unit 340, and the final defect suspect determination unit 350 may be implemented by executing programming instructions on one or more processors in one or more computing systems, such as the computing system illustrated in FIG. 1. Correspondingly, some other embodiments of the disclosed technology may be implemented by software instructions, stored on a non-transitory computer-readable medium, for instructing one or more programmable computers/computer systems to perform the functions of one or more of the failing test pattern simulation unit 310, the initial inter-cell bridge suspect determination unit 320, the passing test pattern simulation unit 330, the defect candidate determination unit 340, and the final defect suspect determination unit 350. As used herein, the term "non-transitory computer-readable medium" refers to computer-readable medium that are capable of storing data for future retrieval and not propagating electro-magnetic waves. The non-transitory computer-readable medium may be, for example, a magnetic storage device, an optical storage device, or a solid state storage device.

It also should be appreciated that, while the failing test pattern simulation unit 310, the initial inter-cell bridge suspect determination unit 320, the passing test pattern simulation unit 330, the defect candidate determination unit 340, and the final defect suspect determination unit 350 are shown as separate units in FIG. 3, a single computer (or a single processor within a master computer) or a single computer system may be used to implement all of these units at different times, or components of these units at different times.

With various examples of the disclosed technology, the input database 305 and the output database 355 may be implemented using any suitable computer readable storage device. That is, either of the input database 305 and the output database 355 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 305 and the output database 355 are shown as separate units in FIG. 3, a single data storage medium may be used to implement some or all of these databases.

Inter-Cell Bridge Defect Diagnosis Process

Figure 4:
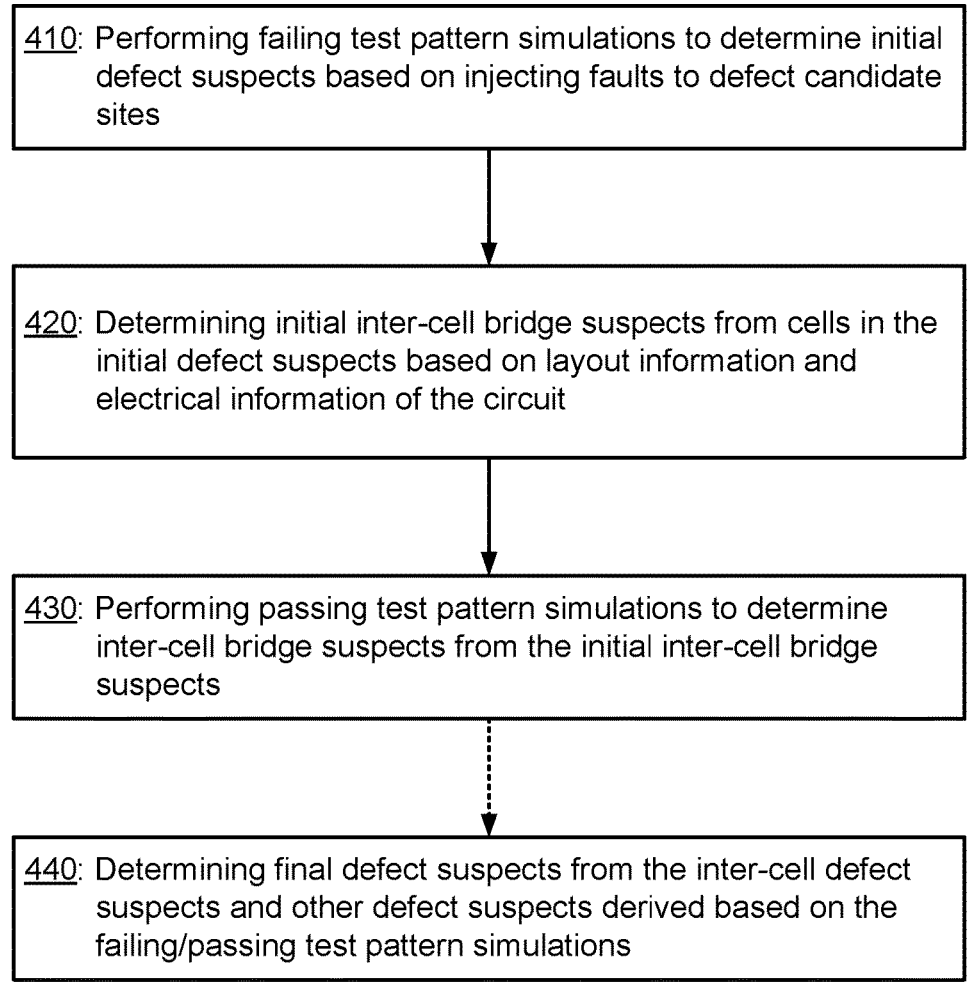
FIG. 4 illustrates a flowchart showing a process of inter-cell bridge defect diagnosis that may be implemented according to various examples of the disclosed technology.
Figure 4:

FIG. 4 illustrates a flowchart 400 showing a process of inter-cell bridge defect diagnosis that may be implemented according to various examples of the disclosed technology. For ease of understanding, methods of inter-cell bridge defect diagnosis that may be employed according to various embodiments of the disclosed technology will be described with reference to the circuit defect diagnosis tool 300 illustrated in FIG. 3 and the flow chart 400 in FIG. 4. It should be appreciated, however, that alternate implementations of a circuit defect diagnosis tool may be used to perform the method of inter-cell bridge defect diagnosis in the flow chart 400 according to various embodiments of the disclosed technology. In addition, it should be appreciated that implementations of the circuit defect diagnosis tool 300 may be employed to implement methods of inter-cell bridge defect diagnosis according to different embodiments of the disclosed technology other than the one illustrated by the flow chart 400 in FIG. 4.

In operation 410, the failing test pattern simulation unit 310 performs failing test pattern simulations to determine initial defect suspects based on injecting faults to defect candidate sites. The defect candidate sites are determined based on test responses. The test responses are obtained by applying test patterns to a circuit. The test patterns may comprise test patterns generated by an automatic test pattern generation (ATPG) process. Additionally or alternatively, the test patterns may comprise test patterns generated for special purposes such as diagnosis. The test responses comprise failing bits caused by defects in the circuit. A failing bit is a bit captured in a scan cells/primary output for a test pattern that is different from the one expected for a defect-free circuit. The information of the failing bits are typically saved in a failure file. For a circuit having a defect, not all of the test patterns can generate failing bits because the fault at the defect site may not be activated or the fault effect cannot be propagated to an observation site (a scan cell or a primary output). Those test patterns that generated failing bits are usually referred to as failing test patterns while those test patterns that generated no failing bits are usually referred to as passing test patterns. Correspondingly, a failing test pattern simulation is a simulation that simulates a failing test pattern on the circuit while a passing test pattern simulation is a simulation that simulates a passing test pattern on the circuit.

A tester such as automatic test equipment (ATE) is usually employed to apply the test patterns to the circuit and to collect the test responses captured by scan cells in the circuit. As noted previously, primary outputs may also be used to capture the test responses. An ATE can automatically test integrated circuits in sophisticated electronic packages such as printed circuit boards or integrated circuits on wafers prior to wafer dicing (often referred to as "dies"). Wafer-based ATEs typically use a device called a Prober that moves across a silicon wafer to test the device and can support testing multiple dies in parallel.

The defect candidate determination unit 340 may be employed to determine the defect candidate sites based on the test responses. One approach the defect candidate determination unit 340 may employ is fault dictionary-based. In this approach, fault simulations are performed to determine the possible responses to a given test pattern in the presence of faults. A fault table or a fault dictionary is then constructed based on the simulation results. After the circuit is tested, the defect candidate determination unit 340 can try to match the actual result of applying the test patterns to the circuit with one of the pre-computed expected results stored in the fault table (dictionary). The result of applying the test patterns to the circuit represents a combination of effects of the fault to each test pattern. The look-up results show the defect candidate sites.

Alternatively, the defect candidate determination unit 340 may use a path-tracing approach to determine the defect candidate sites. The path-tracing approach comprises probing from the scan cells/primary outputs that capture the failing bits into the circuit design. This backward path tracing traces along the sensitized paths obtained based on the good-circuit simulation results of the test patterns. The sensitized paths originated from a failing bit form a "cone". Cones for the failing bits of one test pattern may be processed through operations such as intersection and union to identify the defect candidate sites.

At each of the defect candidate sites, the failing test pattern simulation unit 310 can inject a fault and simulate the failing test patterns included in the test patterns to derive simulated test responses. The simulated test responses are compared with the observed test responses. When matched, the defect candidate site may be designated as one of the initial defect suspects. The injected fault may be a stuck-at fault or a fault for cell internal defect. Either or both of the failing test pattern simulation unit 310 and the defect candidate determination unit 340 can be implemented with corresponding components of a commercial diagnosis tool. An example of such an electronic design automation tool is the Tessent® Diagnosis software tool available from Mentor Graphics Corporation of Wilsonville, Oreg.

Refer back to the flowchart 400. In operation 420, the initial inter-cell bridge suspect determination unit 320 determines initial inter-cell bridge suspects from cells in the initial defect suspects based on layout information and electrical information of the circuit. Inter-cell bridge defects exist only between cells as the name suggests. The number of cells in the defect candidate sites can reach ten thousand for a large design. After the operation 410, the number of cells in the initial defect suspects can be one order of magnitude smaller, but it is still too large. Assume the number of cells in the initial defect suspects is 1000. The number of pairs of cells that can be formed is 1000×(1000−1)/2=499,500. Not every pair of cells, however, can have a bridge defect considering their physical proximity. The initial inter-cell bridge suspect determination unit 320 can analyze the layout information and identify pairs of cells that physically neighbor each other from cells in the initial defect suspects. As such, the number of cell pairs of interest (i.e., cell pairs as potential inter-cell bridge suspects) can be significantly reduced. A pair of neighboring cells may have more than one inter-cell bridge suspects. The initial inter-cell bridge suspect determination unit 320 may further analyze the layout information to search for layout features in each pair of neighboring cells that are close enough to be susceptible to bridge defect formation.

As explained previously, an inter-cell bridge fault may not be activated by a failing test pattern unless good-machine values for the two circuit components involved are opposite to each other. In FIG. 2, for example, a failing test pattern should cause the interconnects 230 and 240 to have opposite good-machine values for the inter-cell bridge defect 250 to be activated. Accordingly, the initial inter-cell bridge suspect determination unit 320 can analyze cell internal signal information included in the electrical information of the circuit to further reduce the number of cell pairs that may be included in the initial inter-cell bridge suspects. The cell internal signal information provides good-machine values for circuit components inside the cell under different cell input signals.

The cell internal signal information can be generated based on transistor-level circuit simulations or switch-level circuit simulations. A transistor-level circuit simulation is an analog simulation. SPICE (Simulation Program with Integrated Circuit Emphasis) is a widely-used general-purpose, open source analog electronic circuit simulator. While accurate, a transistor level circuit simulator like SPICE may be slow because of the inherent complexity of the circuit models. A switch-level circuit simulator trades off accuracy of simulation results with speed of simulation by modeling a transistor as a bi-directional switch. It can be more than a thousand times faster than SPICE. Transistor-level circuit simulations or switch-level circuit simulations may be performed once. The results such as good machine values for circuit components can be saved and used for different circuit designs.

The electrical information of the circuit may further comprise the transistor-level netlists of the cells or the switch-level netlists of the cells. Accordingly, the initial inter-cell bridge suspect determination unit 320 may further determine which cell in a pair of cells is a victim cell based on the transistor-level netlists. A victim cell is a cell in which the circuit component is forced to have the same signal value as the circuit component in the other cell (an aggressor cell) through the inter-cell bridge defect. Victim/aggressor cells can be determined based on the relative driving strengths. The driving strength of a circuit component may be determined based on the number/properties of transistors coupled to the circuit component. If the circuit component in a cell has a weaker driving strength, then the cell is the victim cell. Identifying the victim cell helps to determine how the fault effect can be propagated. In the example shown in FIG. 2, if the cell 210 is determined to be the victim cell, but the failing bits for a particular failing test pattern are caused not by outputs of the cell 210, then the inter-cell bridge defect 250 cannot explain the observed failing bits for this failing test pattern. If the inter-cell bridge defect 250 cannot explain the failing bits for any of the failing test patterns, then it can be eliminated from further determination of the initial inter-cell bridge suspects.

The initial inter-cell bridge suspect determination unit 320 may still further determine whether the inter-cell bridge fault effect in a victim cell can be propagated to one or more observation sites and whether they match the observed failing bits based on faults for cell internal defects and the results of the failing test pattern simulations. This can further reduce the number of the initial defect suspects.

Refer back to the flowchart 400. In operation 430, the passing test pattern simulation unit 330 performs passing test pattern simulations to determine inter-cell bridge suspects from the initial inter-cell bridge suspects. For an initial inter-cell defect suspect, the test patterns that generate no failing bit are simulated. If the simulation results do not match the observation, the initial defective sink cell suspect may be removed from being considered as an inter-cell bridge suspect.

Optionally, in operation 440, the final defect suspect determination unit 350 determines final defect suspects from the inter-cell defect suspects and other defect suspects which also are determined based on the failing test pattern simulations and the passing test pattern simulations. The final defect suspect determination unit 350 may rank all of the defect suspects based on the number of the failing test patterns of which the failing bits can be explained by a defect suspect. The larger number of the failing test patterns, the higher the rank of the defect suspect. Other techniques/criteria may also be employed by the final defect suspect determination unit 350, The identified defect suspects such as the inter-cell bridge suspects can be used to guide the PFA process. They can also be used for a volume diagnosis process. The volume diagnosis process employ statistical or machine learning techniques to analyze diagnosis results for a large number of defective dies. The results of the PFA process or the volume diagnosis process can be used for identifying root causes of low yields or yield excursion. Based on the discovered root causes, the manufacturing process and/or manufacturing equipment may be adjusted.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A method, executed by at least one processor of a computer, comprising:
   performing failing test pattern simulations to determine initial defect suspects based on injecting faults to defect candidate sites, the defect candidate sites determined based on test responses, the test responses obtained by applying test patterns to a circuit for testing, and the test responses comprising failing bits;
   determining initial inter-cell bridge suspects from cells in the initial defect suspects based on layout information and electrical information of the circuit, the determining comprising identifying pairs of neighboring cells based on the layout information, the electrical information of the circuit comprising cell internal signal information which is obtained based on transistor-level circuit simulations or switch-level circuit simulations; and
   performing passing test pattern simulations to determine inter-cell bridge suspects from the initial inter-cell bridge suspects.

2. The method recited in claim 1, wherein the defect candidate sites are determined based on path-tracing from the failing bits into a circuit design of the circuit or based on a fault dictionary.

3. The method recited in claim 1, wherein the faults comprise stuck-at faults.

4. The method recited in claim 1, wherein the faults comprise faults for cell internal defects.

5. The method recited in claim 1, wherein the electrical information of the circuit further comprises switch-level netlists of the cells or transistor-level netlists of the cells, the determining initial inter-cell bridge suspects is further based on driving strengths derived based on the switch-level netlists of the cells or the transistor-level netlists of the cells.

6. The method recited in claim 5, wherein the determining initial inter-cell bridge suspects is further based on faults for cell internal defects and the failing test pattern simulations.

7. The method recited in claim 1, further comprising:
determining final defect suspects from the inter-cell defect suspects and other defect suspects determined based on the failing test pattern simulations and the passing test pattern simulations.

8. One or more non-transitory computer-readable media storing computer-executable instructions for causing one or more processors to perform a method, the method comprising:
performing failing test pattern simulations to determine initial defect suspects based on injecting faults to defect candidate sites, the defect candidate sites determined based on test responses, the test responses obtained by applying test patterns to a circuit for testing, and the test responses comprising failing bits;
determining initial inter-cell bridge suspects from cells in the initial defect suspects based on layout information and electrical information of the circuit, the determining comprising identifying pairs of neighboring cells based on the layout information, the electrical information of the circuit comprising cell internal signal information which is obtained based on transistor-level circuit simulations or switch-level circuit simulations; and
performing passing test pattern simulations to determine inter-cell bridge suspects from the initial inter-cell bridge suspects.

9. The one or more non-transitory computer-readable media recited in claim 8, wherein the defect candidate sites are determined based on path-tracing from the failing bits into a circuit design of the circuit or based on a fault dictionary.

10. The one or more non-transitory computer-readable media recited in claim 8, wherein the faults comprise stuck-at faults.

11. The one or more non-transitory computer-readable media recited in claim 8, wherein the faults comprise faults for cell internal defects.

12. The one or more non-transitory computer-readable media recited in claim 8, wherein the electrical information of the circuit further comprises switch-level netlists of the cells or transistor-level netlists of the cells, the determining initial inter-cell bridge suspects is further based on driving strengths derived based on the switch-level netlists of the cells or the transistor-level netlists of the cells.

13. The one or more non-transitory computer-readable media recited in claim 12, wherein the determining initial inter-cell bridge suspects is further based on faults for cell internal defects and the failing test pattern simulations.

14. The one or more non-transitory computer-readable media recited in claim 8, wherein the method further comprises:
determining final defect suspects from the inter-cell defect suspects and other defect suspects determined based on the failing test pattern simulations and the passing test pattern simulations.

15. A system, comprising:
one or more processors, the one or more processors programmed to perform a method, the method comprising:
performing failing test pattern simulations to determine initial defect suspects based on injecting faults to defect candidate sites, the defect candidate sites determined based on test responses, the test responses obtained by applying test patterns to a circuit for testing, and the test responses comprising failing bits;
determining initial inter-cell bridge suspects from cells in the initial defect suspects based on layout information and electrical information of the circuit, the determining comprising identifying pairs of neighboring cells based on the layout information, the electrical information of the circuit comprising cell internal signal information which is obtained based on transistor-level circuit simulations or switch-level circuit simulations; and
performing passing test pattern simulations to determine inter-cell bridge suspects from the initial inter-cell bridge suspects.

16. The system recited in claim 15, wherein the defect candidate sites are determined based on path-tracing from the failing bits into a circuit design of the circuit or based on a fault dictionary.

17. The system recited in claim 15, wherein the faults comprise stuck-at faults, faults for cell internal defects, or both.

18. The system recited in claim 15, wherein the electrical information of the circuit further comprises switch-level netlists of the cells or transistor-level netlists of the cells, the determining initial inter-cell bridge suspects is further based on driving strengths derived based on the switch-level netlists of the cells or the transistor-level netlists of the cells.

19. The system recited in claim 15, wherein the method further comprises:
determining final defect suspects from the inter-cell defect suspects and other defect suspects determined based on the failing test pattern simulations and the passing test pattern simulations.

* * * * *